United States Patent
Van Dijk et al.

(10) Patent No.: US 6,367,049 B1
(45) Date of Patent: Apr. 2, 2002

(54) ENCODING MULTIWORD INFORMATION BY WORDWISE INTERLEAVING

(75) Inventors: Marten E. Van Dijk; Ludovicus M. G. M. Tolhuizen; Josephus A. H. M. Kahlman; Constant P. M. J. Baggen, all of Eindhoven (NL); Masayuk Hattori, Kitashinagawa-Ku (JP); Kouhei Yamamoto, Kitashinagawa (JP); Tatsuya Narahara; Susumu Senshu, both of Kitashinagawa-Ku (JP)

(73) Assignees: U.S. Philips Corp., New York, NY (US); Sony Corp., Tokyo (JP)

(*) Notice: Subject to any disclaimer, the term of this patent is extended or adjusted under 35 U.S.C. 154(b) by 0 days.

(21) Appl. No.: 09/361,073

(22) Filed: Jul. 26, 1999

(30) Foreign Application Priority Data

Jul. 27, 1998 (EP) .............................. 98202511

(51) Int. Cl.[7] .............................. G06F 11/10
(52) U.S. Cl. .................. 714/761; 714/756; 714/758
(58) Field of Search .................. 714/761, 756, 714/758, 751, 701

(56) References Cited

U.S. PATENT DOCUMENTS

| | | | | |
|---|---|---|---|---|
| 4,559,625 A | * | 12/1985 | Berlekamp et al. | |
| 5,299,208 A | * | 3/1994 | Blaum et al. | |
| 5,471,486 A | * | 11/1995 | Baggen et al. | |
| 5,583,889 A | * | 12/1996 | Citta et al. | |
| 5,623,504 A | * | 4/1997 | Tolhuizen | |
| 5,633,635 A | * | 5/1997 | Ohishi et al. | |

* cited by examiner

Primary Examiner—Phung M. Chung
(74) Attorney, Agent, or Firm—Michael E. Belk

(57) ABSTRACT

Multiword information is based on multibit symbols disposed in relative contiguity with respect to a medium, and is encoded with a wordwise interleaving and wordwise error protection code for providing error locative clues across multiword groups. In particular, the clues originate in high protectivity clue words (BIS) that are interleaved among clue columns, and also in synchronizing columns constituted from synchronizing bit groups. The synchronizing columns are located where the clue columns are relatively scarcer disposed. The clues are directed to low protectivity target words (LDS) that are interleaved in a substantially uniform manner among target columns which form uniform-sized column groups between periodic arrangements of clue columns and synchronizing columns.

61 Claims, 16 Drawing Sheets

|  | 0 | 1 | : | L | : | 17 | 18 |
|---|---|---|---|---|---|---|---|
|  | $d_{0,0}$ | $d_{1,0}$ | : | $d_{L,0}$ | : | $d_{17,0}$ | $d_{18,0}$ |
|  | $d_{0,1}$ | $d_{1,1}$ | : | $d_{L,1}$ | : | $d_{17,1}$ | $d_{18,1}$ |
|  | $d_{0,2}$ | : | : | : | : | : | : |
|  | $d_{0,3}$ | : | : | : | : | : | : |
|  | : | : | : | : | : | : | : |
|  | : | : | : | : | : | : | : |
|  | : | : | : | : | : | : | : |
|  | $d_{0,215}$ | $d_{1,215}$ | : | $d_{L,215}$ | : | $d_{17,215}$ | $d_{18,215}$ |
|  | $p_{0,216}$ | $p_{1,216}$ |  | $p_{L,216}$ |  | $p_{17,216}$ | $p_{18,216}$ |
|  |  |  |  |  |  |  |  |
|  |  |  |  |  |  |  |  |
|  |  |  |  |  |  |  |  |
|  |  |  |  |  |  |  |  |
|  | $p_{0,247}$ | $p_{1,247}$ |  | $p_{L,247}$ |  | $p_{17,247}$ | $p_{18,247}$ |

← 19 code words →

216 rows with data 32 rows with parity

| sector s | row r | byte number N,C from BIS Block column e | | | shift right (= mod(r,3)) | filling in upward direction |
|---|---|---|---|---|---|---|
| | | 0 | 1 | 2 | | |
| 0 | 0 | 0,0 | 0,1 | 0,2 | 0 | start of Block row N = 0 |
| | 1 | 2,5 | 2,3 | 2,4 | 1 | ↑ continuation of Block row N = 2 |
| | 2 | 4,7 | 4,8 | 4,6 | 2 | |
| | 3 | 6,9 | 6,10 | 6,11 | 0 | |
| | ⋮ | | | | | |
| | 7 | 14,23 | 14,21 | 14,22 | 1 | |
| | 8 | 16,1 | 16,2 | 16,0 | 2 | start of Block row N = 16 |
| | ⋮ | | | | | |
| | 30 | 60,18 | 60,19 | 60,20 | 0 | |
| 1 | 0 | 0,21 | 0,22 | 0,23 | 0 | end of Block row N = 0 |
| | 1 | 2,2 | 2,0 | 2,1 | 1 | start of Block row N = 2 |
| | 2 | 4,4 | 4,5 | 4,3 | 2 | |
| | 3 | 6,6 | 6,7 | 6,8 | 0 | |
| | ⋮ | | | | | |
| 2 | 0 | 0,18 | 0,19 | 0,20 | 0 | |
| | 1 | 2,23 | 2,21 | 2,22 | 1 | end of Block row N = 2 |
| | 2 | 4,1 | 4,2 | 4,0 | 2 | start of Block row N = 4 |
| | 3 | 6,3 | 6,4 | 6,5 | 0 | |
| | ⋮ | | | | | |
| 3 | 0 | 0,15 | 0,16 | 0,17 | 0 | |
| | 1 | 2,20 | 2,18 | 2,19 | 1 | |
| | 2 | 4,22 | 4,23 | 4,21 | 2 | |
| | 3 | 6,0 | 6,1 | 6,2 | 0 | start of Block row N = 6 |
| | ⋮ | | | | | |
| 4 | 0 | 0,12 | 0,13 | 0,14 | 0 | |
| | 1 | 2,17 | 2,15 | 2,16 | 1 | |
| | 2 | | | | | |
| | ⋮ | | | | | |

FIG. 17(1)

| sector s | row r | byte number N,C from BIS Block column e | | | shift right (= mod(r,3)) | filling in upward direction |
|---|---|---|---|---|---|---|
| | | 0 | 1 | 2 | | |
| 8 | 0 | 1,0 | 1,1 | 1,2 | 0 | start of Block row N = 1 |
| | 1 | 3,5 | 3,3 | 3,4 | 1 | |
| | 2 | 5,7 | 5,8 | 5,6 | 2 | |
| | 3 | 7,9 | 7,10 | 7,11 | 0 | |
| | ⋮ | | | | | |
| | 8 | 17,1 | 17,2 | 17,0 | 2 | start of Block row N = 17 |
| | ⋮ | | | | | |
| | 30 | 61,18 | 61,19 | 61,20 | | |
| 9 | 0 | 1,21 | 1,22 | 1,23 | | end of Block row N = 1 |
| 10 | 0 | 1,18 | 1,19 | 1,20 | | |
| 11 | 0 | 1,15 | 1,16 | 1,17 | | |
| 12 | 0 | 1,12 | 1,13 | 1,14 | | |
| 13 | 0 | 1,9 | 1,10 | 1,11 | | |
| 14 | 0 | 1,6 | 1,7 | 1,8 | | |
| 15 | 0 | 1,3 | 1,4 | 1,5 | 0 | continuation of Block row N = 1 |
| | 1 | 3,8 | 3,6 | 3,7 | 1 | |
| | 2 | 5,10 | 5,11 | 5,9 | 2 | |
| | ⋮ | | | | | |
| | 7 | 15,2 | 15,0 | 15,1 | 1 | start of Block row N = 15 |
| | ⋮ | | | | | |
| | 30 | 61,21 | 61,22 | 61,23 | 0 | end of Block row N = 61 |

FIG. 18

ENCODING MULTIWORD INFORMATION BY WORDWISE INTERLEAVING

BACKGROUND OF THE INVENTION

The invention relates to a method according to the preamble of claim 1. U.S. Pat. No. 4,559,625 to Berlekamp et al, and U.S. Pat. No. 5,299,208 to Blaum et al disclose decoding of interleaved and error protected information words, wherein an error pattern found in a first word may give a clue to locate errors in another word of the same group of words. The references use a fault model with multisymbol error bursts across plural words. An error in a particular word yields a high probability for an error to occur at a corresponding symbol position pointed at in a next word or words. The procedure may raise the number of corrected errors. A clue will however only materialize when the clue word has been fully corrected. Furthermore, the medium stores information as well as synchronization bit groups which represent an appreciable amount of redundancy that may also be used to signal errors in the target words, so that to some extent clue words may be exchanged for synchronization bit groups. Part of the errors is due to so-called bit slips that are more frequent further away from the sync bit groups. Therefore, interleaving the clue words amongst clue columns and also interleaving the target words amongst target columns may further improve the error protection.

SUMMARY TO THE INVENTION

In consequence, amongst other things, it is an object of the present invention to provide a coding format allowing clue words to cooperate with synchronizing bit groups in a systematic format, while also smoothing out possibly negative effects of bit slips more evenly among the various words. Now therefore, according to one of its aspects the invention is characterized as recited in the characterizing part of claim 1. A clue can point to an erasure symbol. Pointing can make error correction more powerful. In fact, many codes will correct at most t errors when no error locative indication is known. Given the erasure locations, generally a larger number e>t of erasures may be corrected. Also protection against a combination of bursts and random errors may improve. The invention may be used both for storage and for transmission.

Advantageously, the method has the features of claim 2. This is a relatively simple arrangement. Alternatively, the number of synchronizing columns may be larger than one, and the number of clue columns may be even if preferred.

Advantageously, the method has the features of claim 3. In video recording, user data will relate to the image and accompanying sound to be presented to a user, whereas system data may indicate the program name, time, addresses, and various other parameters that may be useful without reference to the video or audio proper. This feature allows fast access to the system data without necessity for decoding the target words.

Advantageously, the method has the features of claim 4. If error-free, this feature will immediately indicate to a user device whether the processed frame of information is correct.

Advantageously, the method has the features of claim 5. This is a straightforward organization. Advantageously, the method has the features of claim 6. This has proven to raise the worst case to the average level attainable for this code format. Advantageously, the method has the features of claim 7. Optical storage has been proven a fortuitous medium.

The invention also relates to a method for decoding information so encoded, to an encoding and/or decoding device for use with the method, and to a carrier containing information so encoded. Further advantageous aspects of the invention are recited in dependent claims.

BRIEF DESCRIPTION OF THE DRAWING

These and further aspects and advantages of the invention will be discussed more in detail hereinafter with reference to the disclosure of preferred embodiments, and in particular with reference to the appended FIGURES that show:

FIG. 9, renumbering data bytes and forming an ECC sector by adding parities;

FIG. 12, an interleaved ECC cluster;

FIG. 18, an example of the partial mapping of BIS bytes on the last eight sectors;

DETAILED DESCRIPTION OF PREFERRED EMBODIMENTS

Figure 1A:
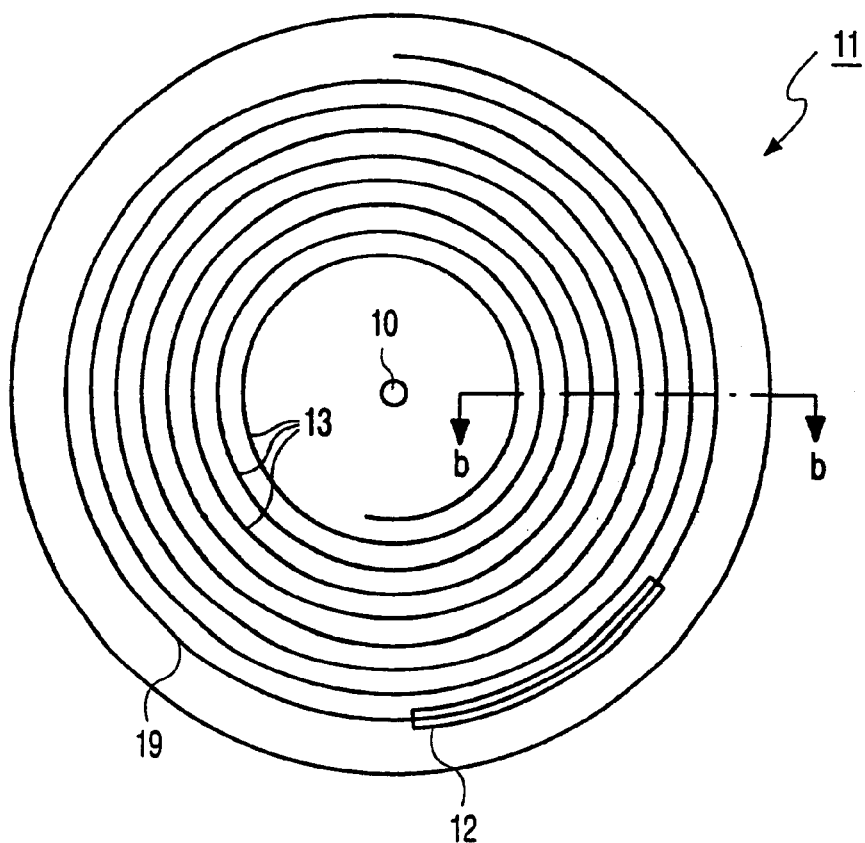
FIGS. 1a, 1b, a record carrier.

FIG. 1a shows a disc-shaped record carrier 11 with track 19 and central hole 10. Track 19 is arranged in a spiral pattern of turns forming substantially parallel tracks on an information layer. The carrier may be an optical disc with a recordable or prerecorded information layer. CD-R, CD-RW, and DVD-RAM are recordable, whereas audio-CD is an example of a prerecorded disc. The prerecorded type can be manufactured in a known way by first recording a master disc and then pressing consumer discs. On a recordable carrier the track is indicated by a pre-embossed track structure provided during manufacture of the blank carrier. The track may be structured as a pregroove 14 to enable a read/write head to follow the track 19 during scanning. Information is represented on the information layer by optically detectable marks, e.g. pits and lands.

Figure 1B:
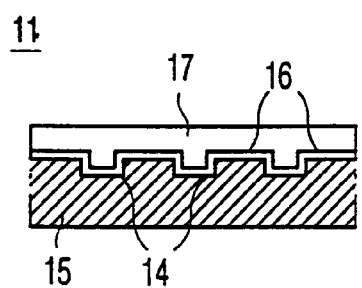

FIG. 1b is a cross-section along line b—b of the record carrier 11 of the recordable type, transparent substrate 15 being provided with recording layer 16 and protective layer 17. Pregroove 14 may be implemented as an indentation or an elevation, or as a material property deviating from its surroundings.

The record carrier may carry user information, that for user convenience has been sub-divided into smaller items, that each may have a duration of a few minutes e.g. songs of an album or movements of a symphony. Access information for identifying the items can also be provided on the carrier, e.g. a so-called Table Of Contents (TOC) or a file system like ISO 9660 for CD-ROM. The access information may include playing time and start address for each item, and further information like a song title. Such information may represent system information. The information is recorded in a digital manner after analog to digital (A/D) conversion.

Figure 2:
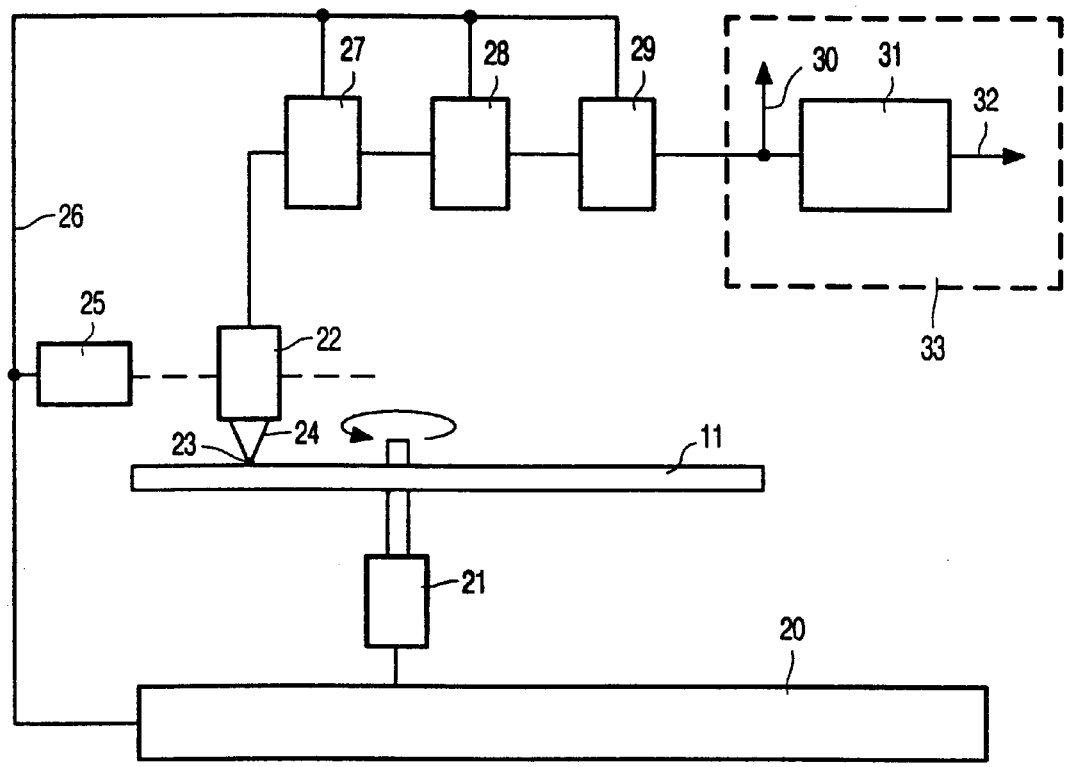
FIG. 2, a playback device.

FIG. 2 shows a playback apparatus according to the invention for reading a record carrier 11 such as shown in FIG. 1. The device has a drive 21 for rotating the record carrier 1, and read head 22 for scanning the track on the record carrier. The apparatus has positioning means 25 for coarse radial positioning of the read head 22. The read head comprises an optical system of a known type for generating a radiation beam 24 guided through optical elements focussed to a radiation spot 23 on a track of the information layer. The radiation beam 24 is generated by a known radiation source. The read head further has a focusing actuator for moving the focus of the radiation beam 24 along the optical axis of the beam and a tracking actuator for fine positioning of the spot 23 in a radial direction on the track centre. The tracking actuator may comprise coils for radially moving an optical element or may be arranged for changing the angle of a reflecting element. The radiation reflected by the information layer is detected by a detector of a usual type, e.g. a four-quadrant diode, in the read head 22 for generating a read signal and further detector signals including a tracking error and a focusing error signal coupled to said tracking and focusing actuators. The read signal is processed by reading means 27 to retrieve the data, which reading means are of a usual type for example comprising a channel decoder and an error corrector. The retrieved data is sent to data selection facility 28 to select certain information from the data read and sends it to buffer 29. The selection is based on data type indicators recorded on the record carrier, e.g. headers in a framed format. The compressed information is sent from buffer 29 to de-compressor 31 via signal 30. This signal may also be externally available. The de-compressor 31 decodes the data to reproduce the original information on output 32. The de-compressor may be fitted separately, as indicated by the rectangle 33 in FIG. 2. Alternatively, the buffer may be positioned before the data selection. Control unit 20 furthermore receives control commands from a user or from a host computer via control lines 26 such as a system bus, connecting drive 21, positioning means 25, reading means 27 and data selection means 28, and possibly also buffer 29 for buffer filling level control. Thereto, control unit 20 comprises control circuitry, such as a microprocessor, a program memory and control gates, or a state machine.

Compression and de-compression are well-known. During de-compression an inverse process is applied to reconstruct the original signal. If the original digitized signal is reconstructed exactly, the (de-)compression is lossless, but in lossy (de)-compression some details of the original signal will not be reproduced. Such omitted details are substantially undetectable by the human ear or eye. Most known systems, such as MPEG, use lossy compression for audio and video; lossless compression is used from storing computer data.

The data selection 28 is arranged for retrieving control information from the data read, and for discarding any stuffing data that had been added during recording. The rotation rate may be adjusted using the average filling level of the buffer 29, e.g. decreasing the rotation rate when the buffer is more then 50% full on average.

Figure 3:
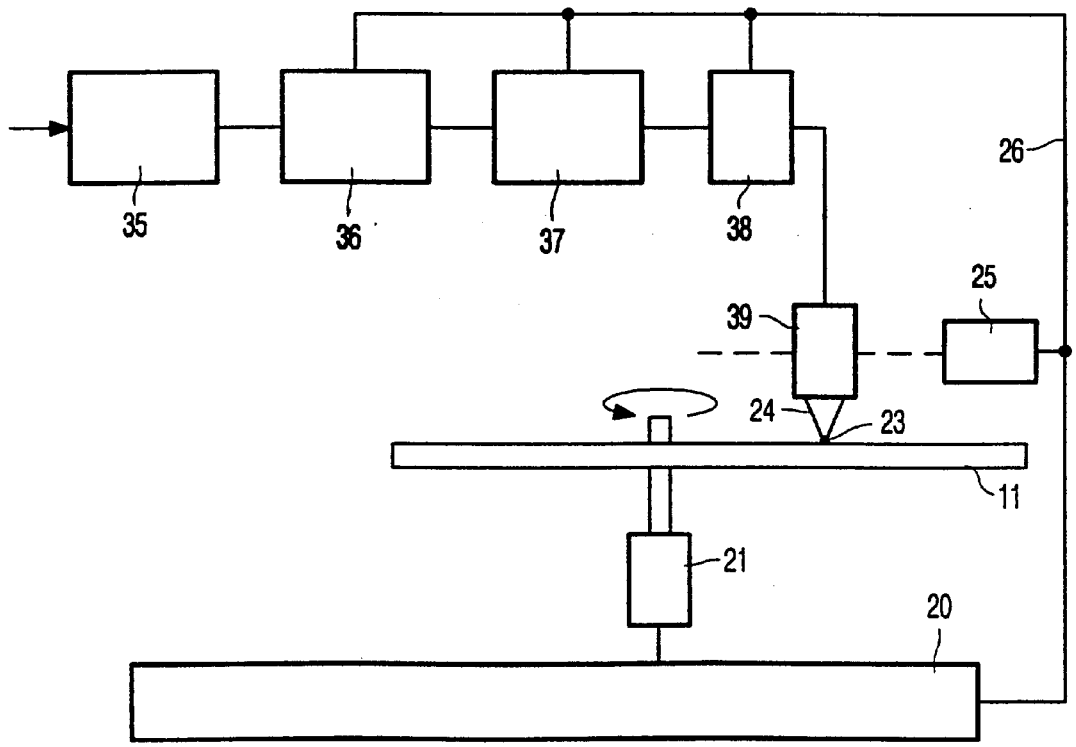
FIG. 3, a recording device.

FIG. 3 shows a recording device for writing information on a (re)writable record carrier 11. During a writing operation, marks representing the information are formed on the record carrier. The marks may be in any optically readable form, e.g. in the form of areas whose reflection coefficient differs from their surroundings, through recording in materials such as dye, alloy or phase change, or in the form of areas with a direction of magnetization different from their surroundings, when recording in magneto-optical material. Writing and reading of information for recording on optical disks and usable formatting, error correcting and channel coding rules are well-known in the art, e.g. from the CD system. The marks can be formed through a spot 23 generated on the recording layer via a electromagnetic radiation beam 24 from a laser diode. The recording device comprises similar basic elements as the apparatus for reading described above in FIG. 2, i.e. control unit 20, drive means 21 and positioning means 25, but it has a write head 39. The information is presented on the input of compression means 35, that may be placed in a separate housing. The variable bitrate compressed information on the output of the compression means 35 is passed to buffer 36. From the buffer 36 the data is passed to data combination means 37 for adding stuffing data and further control data. The total data stream to be recorded is passed to writing means 38. The write head 39 is coupled to the writing means 38, which comprise a formatter, an error encoder and a channel modulator. The data presented to the input of the writing means 38 is distributed over logical and physical sectors according to formatting and encoding rules discussed infra, and converted into a write signal for write head 39. Unit 20 is arranged to control the buffer 36, the data combination means 37 and the writing means 38 via control lines 26 and for performing the positioning procedure as described above for the reading apparatus. The recording apparatus may be arranged for reading through the features of a playback apparatus and a combined write/read head.

Figure 4:
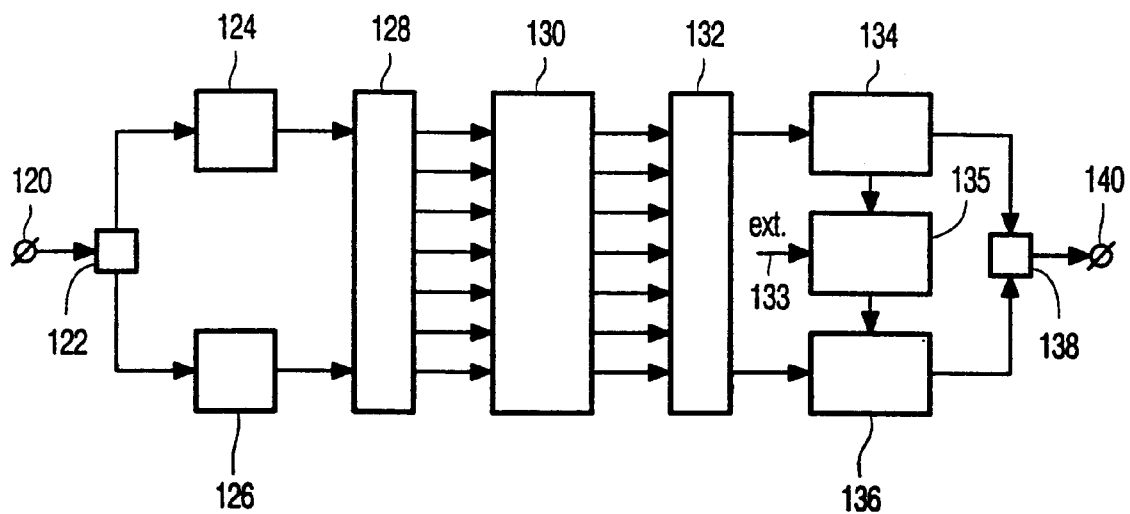
FIG. 4, a system with encoder, carrier, and decoder.
Figure 5:
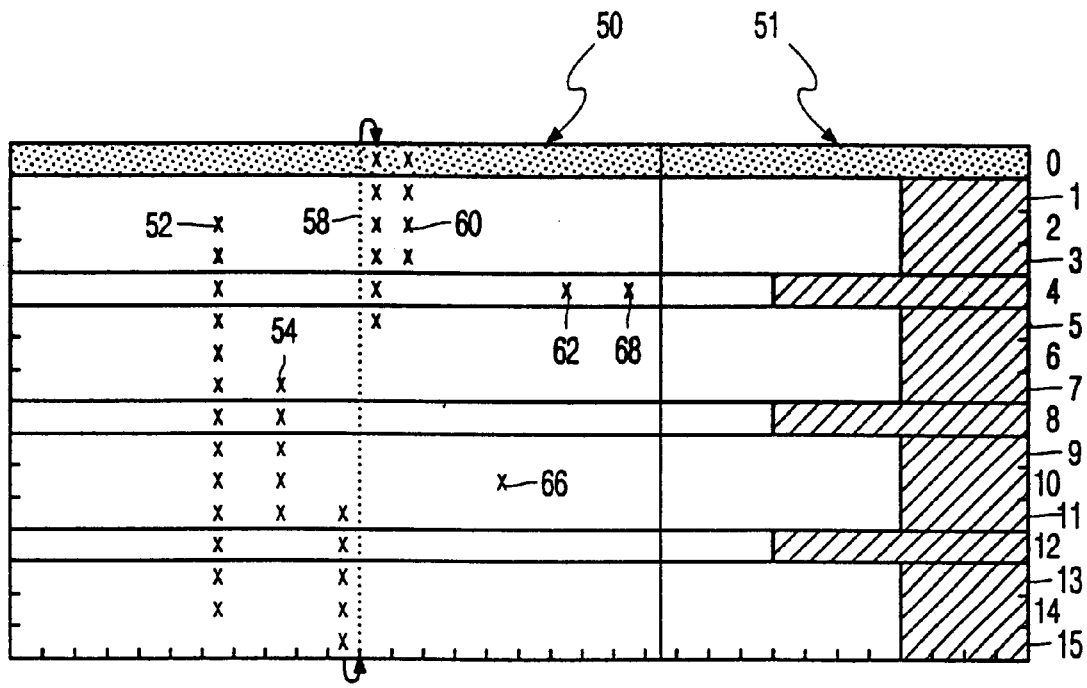
FIG. 5, a code format principle.

FIG. 4 shows a comprehensive system according to the invention, provided with an encoder, a carrier, and a decoder. The embodiment is used for encoding, storing, and finally decoding a sequence of samples or multibit symbols derived from an audio or video signal, or from data. Terminal 120 receives a stream that may have eight bit symbols. Splitter 122 recurrently and cyclically transfers first symbols intended for the clue words to encoder 124, and all other symbols to encoder 126. In encoder 124 the clue words are formed by encoding the data into code words of a first multi-symbol error correcting code. This code may be a Reed-Solomon code, a product code, an interleaved code, or a combination. In encoder 126 the target words are formed by encoding into code words of a second multi-symbol error correcting code. In FIG. 5, all code words have a uniform length, but this is not a restriction. The clue words may have a much higher degree of error protection. This may be effected by a larger number of check symbols, by a smaller number of data symbols, or by a combination thereof.

In block 128, the code words are transferred to one or more outputs of which an arbitrary number has been indicated, so that the distribution on a medium to be discussed later will become uniform. Block 130 symbolizes the unitary medium such as tape or disc that receives the encoded data. This may relate to direct writing in a write-mechanism-plus-medium combination. Alternatively, the medium may be a copy from a master encoded medium such as a stamp. Storage may be optical and fully serial, but other configurations may be used. In block 132, the various words are read again from the medium. Then the clue words of the first code will be sent to decoder 134, and decoded as based on their inherent redundancies. Furthermore, as will become apparent in the discussion of FIG. 5 hereinafter, such decoding may present clues on the locations of errors in other than these clue words. Moreover, the information from synchronizing bit columns may be analyzed as to interferences therein, to immediately produce additional clues for the target words. Box 135 receives all clues and contains a program for using one or more different strategies to translate such clues to erasure locations. The target words are decoded in decoder 136. With help from the erasure locations, the error protection of the target words is raised to a higher level. Finally, all decoded words are demultiplexed by means of element 138 to output 140 conforming to the original format. For brevity, electromechanical interfaces between the various subsystems were ignored.

FIG. 5 illustrates a simple code format. The coded information has been shown arranged in a 480 symbol block with 15 horizontal rows and 32 vertical rows. Storage on a medium starts at the top left and proceeds along vertical rows. The hatched region contains check symbols: horizontal rows 4, 8, and 12 have 8 check symbols each and constitute clue words. The other rows contain 4 check symbols each and constitute target words. The whole block has 408 information symbols and 72 check symbols. The latter may be localized in a more distributed manner over respective words. Further to the above, the top horizontal row contains a representation of synchronizing bit groups. These are present on the medium to synchronize a reader device to the format, but generally contain neither system data nor user data and have a prescribed format with much redundancy. Therefore, it is often easy to detect an interference, and the occurrence of a single one or a plurality of disturbed synchronizing bit groups that are physically close to each other or to distributed clue symbols can be used to signal occurrence of a burst error. This will produce clues in similar manner as the clue words.

The Reed-Solomon code allows to correct in each clue word up to four symbol errors. Actual symbol errors have been indicated by a crosses. In consequence, all clue words may be decoded correctly, inasmuch as they do not have more than four errors. Notably words 2 and 3 may however not be decoded on the basis of their own redundancy alone. In the Figure, all errors, except 62, 66, 68 represent error strings. Only strings 52 and 58 cross at least three consecutive clue words and are considered as error bursts, causing at least all intermediate symbol locations to get an erasure flag. Also, target words just before the first clue word error of the burst and target words just after the last clue word error of the burst may get an erasure flag at that location, depending on the strategy followed. String 54 is not considered a burst, because it is too short.

As a consequence, two of the errors in word 4 produce an erasure flag in the associated vertical rows. This renders words 2 and 3 correctable, each with one error symbol and two erasure symbols. However, random errors 62, 68, nor string 54 constitute clues for words 5, 6, 7, because each of them contains only one clue word. Sometimes, an erasure cause a zero error pattern, because an arbitrary error in an 8-bit symbol has a $1/256$ probability to cause again a correct symbol. Likewise, a long burst crossing a particular clue word may produce a correct symbol therein. By a bridging strategy between preceding and succeeding clue symbols of the same burst, this correct symbol is then incorporated into the burst, and in the same manner as erroneous clue symbols translated into erasure values for appropriate target symbols. The above decisions may vary according to decoding policy. The clues by the sync bit groups may be used in similar manner as those from the clue words.

The relevance of the present invention is brought about by newer methods for digital optical storage. A particular feature is that in the case of substrate incident reading the upper transmissive layer is as thin as 100 micron. The channel bits have a size of some 0.14 micron, so that a data byte at channel rate of $2/3$ will have a length of only 1.7 microns. At the top surface the beam has a diameter of some 125 microns. A caddy or envelope for the disc will reduce the probability of large bursts. Non-conforming particles of less than 50 microns may cause short faults, although the invention is also useful against longer faults. A fault model has been used wherein 50 micron faults through error propagation may lead to bursts of 200 microns, corresponding to some 120 Bytes. A particular model has fixed size bursts of 120B that start randomly with a probability per byte of $2.6*10^{-5}$, or on the average one burst per 32 kB block. The invention has been conceived for optical disc storage, but other configurations such as multitrack tape, and other technologies such as magnetic and magneto-optical would also benefit from the improved approach.

Discussion of a Preferred Format of the Information

Before recording, User Data received from a source, that may be an application or a host, is formatted in a number of successive steps, that will be explained more in detail with reference to FIG. 19, as follows: Data Frames, Data Sectors, ECC Sectors, an ECC Cluster, a BIS Cluster, a Physical Cluster and Recording Frames.

Figure 6:
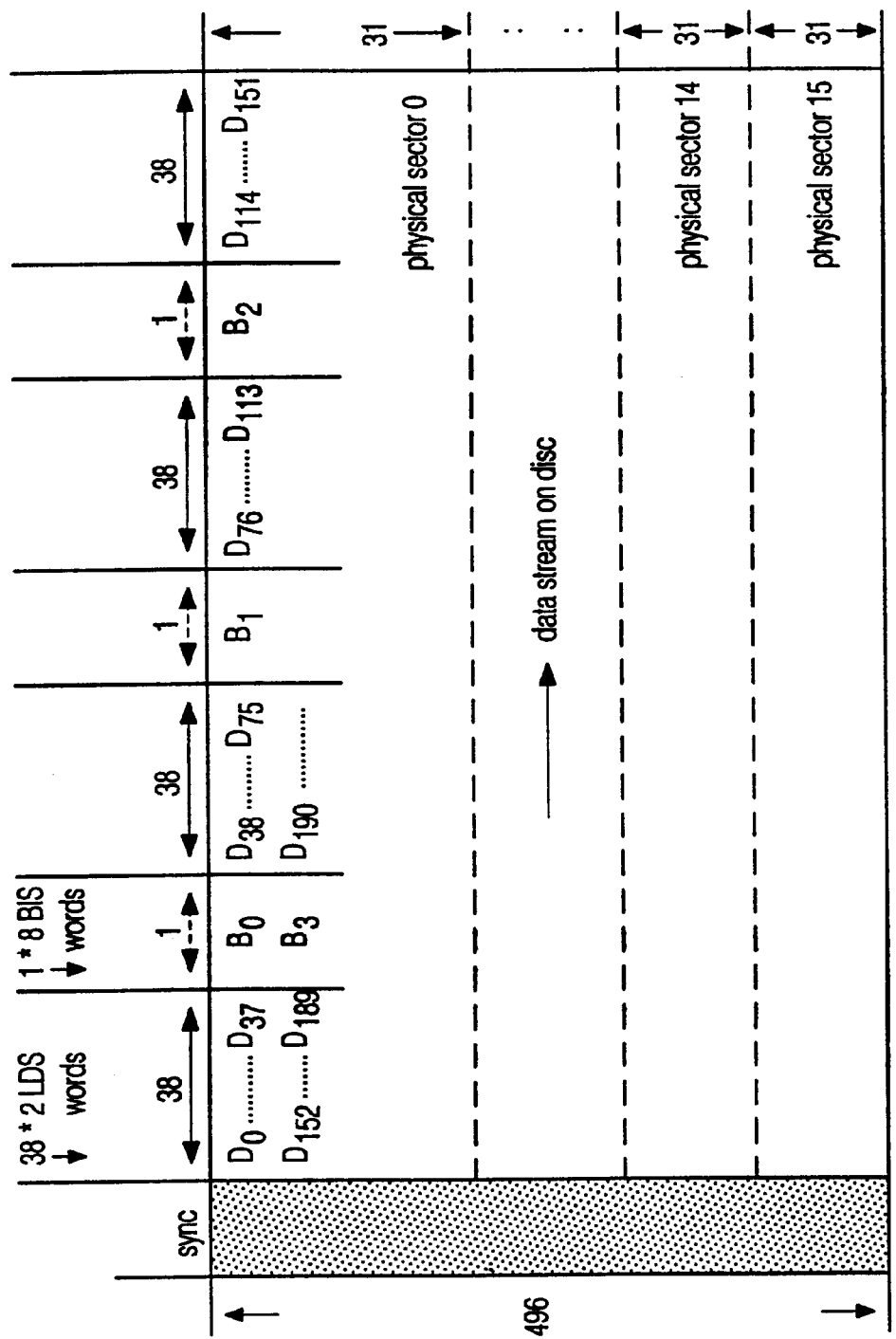
FIG. 6, a schematic representation of a physical cluster on the carrier.

The data is recorded in 64 k partitions, called Physical Clusters, that each contain 32 Data Frames with 2048 bytes of User Data. A Physical Cluster is protected by two error correction mechanisms:

firstly, a Long Distance (LDS) (248,216,33) Reed-Solomon (RS) error correction code;

secondly, the data is multiplexed with a Burst Indicator Subcode (BIS), that consists of (62,30,33) Reed-Solomon (RS) codewords. The number of parity symbols is equal for the two code categories, which allows to use the same decoder hardware for both cases. The BIS code is used to indicate long burst errors, by which the LDS code can more efficiently perform erasure corrections. All data is arranged in an array as shown in FIG. 6. Note that the horizontal and vertical directions have been interchanged with respect to FIG. 5. The array is read along a horizontal direction, and is recorded on the disc after inserting synchronization patterns and additional d.c. control bits, and after modulation.

The error correction codes are applied in vertical direction, which gives a good basic break-up of burst errors on the disc. Additionally, the LDS codewords have been interleaved in a diagonal direction. For the purpose of addressing, a whole Physical Cluster is subdivided into 16 Physical Sectors, each consisting of 32 consecutive rows.

A Data Frame consists of 2052 bytes: 2048 User Data bytes numbered $d_0$ to $d_{2047}$ and 4 Error Detection Code (EDC) bytes numbered $e_{2048}$ to $e_{2051}$. The bytes $e_{2048}$ to $e_{2051}$ contain an Error Detection Code computed over 2048 bytes of the Data Frame. The Data Frame is considered as a field of single bits, starting with the most significant bit of the first User Data byte $d_0$ and ending with the least significant bit of the last EDC byte $e_{2051}$. The msb is $b_{16415}$ and the lsb is $b_0$. Each bit $b_i$ of the EDC is shown as follows for i=0 to 31:

$$EDC(x) = \sum_{i=31}^{0} b_i x^i I(x) \bmod G(x)$$

where:

$$I(x) = \sum_{i=16415}^{32} b_i x^i, \; G(x) = x^{32} + x^{31} + x^4 + 1 \quad (1)$$

Figures 7, 8:
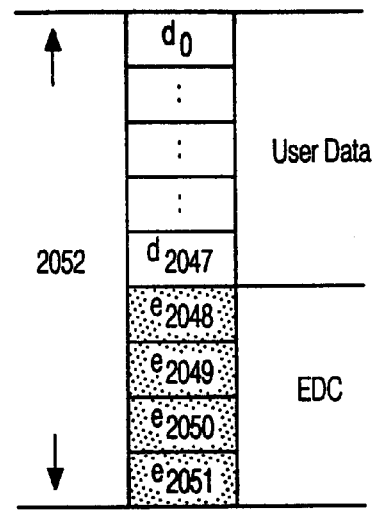
FIG. 7, a data frame.
FIG. 8, a composition of a data sector from two data frames.

Next, two Data Frames (A, B) are placed in an array of 19 columns by 216 rows, called a Data Sector. The filling of the array is done column by column, starting at the top of the first one with byte $do_{0,A}$ and ending at the bottom of the last column with byte $e_{2051,B}$, cf. FIG. 8.

Next in FIG. 9, the bytes in each column of the Data Sector are renumbered starting from the top of the column as follows: $d_{L,0}, d_{L,1} \ldots d_{L,i} \ldots$ to $d_{L,215}$, L being the column number (0 . . . 18). The ECC Sector is completed by extending each column with 32 Parity bytes of a (248,216, 33) long distance RS code. The Parity bytes are: $P_{L,216}$, $P_{L,217}, \ldots P_{L,j} \ldots$ to $P_{L,247}$.

The long distance RS code is defined over the finite field $GF(2^8)$. Non-zero elements of the finite field $GF(2^8)$ are generated by a primitive element $\alpha$ that is a root of the primitive polynomial $p(X)=X^8+X^4+X^3+X^2 30\; 1$. The symbols of $GF(2^8)$ are represented by 8-bit bytes, using a polynomial base representation with $(\alpha^7, \alpha^6, \alpha^5, \ldots \alpha^2, \alpha, 1)$ as a basis. The root $\alpha$ is represented as $\alpha$=00000010. Each LDS codeword, represented by the vector lds=$(d_{L,0} \ldots d_{L,i} \ldots d_{L,215}\; P_{L,216}\text{—}P_{L,j}\text{—}P_{L,247})$, belongs to a Reed-Solomon code over $GF(2^8)$, with 216 information bytes and 32 parity bytes. Such codeword can be represented by a polynomial lds(x) of degree 247, that may have some coefficients zero, the highest degrees corresponding to the information part of the vector $(d_{L,0} \ldots$ etc.) and the lowest degrees corresponding to the parity part $(P_{L,216} \ldots$ etc.). Now, lds(x) is a multiple of the generator polynomial g(x) of the LDS codeword. The generator polynomial is:

$$g(x) = \prod_{i=0}^{31} (x - \alpha^i)$$

The LDS code is systematic: the 216 information bytes appear unaltered in the highest order positions of each codeword. The parity check matrix of code lds is such that: $H_{LDS}*\text{lds}^T = 0$ for all LDS codewords lds.

The second row $H_{LDS\,2}$ of the parity check matrix $H_{LDS}$ is given by $H_{LDS\,2} = (\alpha^{247}\; \alpha^{246} \ldots \alpha^2\; \alpha\; 1)$ and corresponds to the zero $\alpha$ of the generator polynomial g(x) which defines the codeword positions to be used for error locations.

Figure 10:
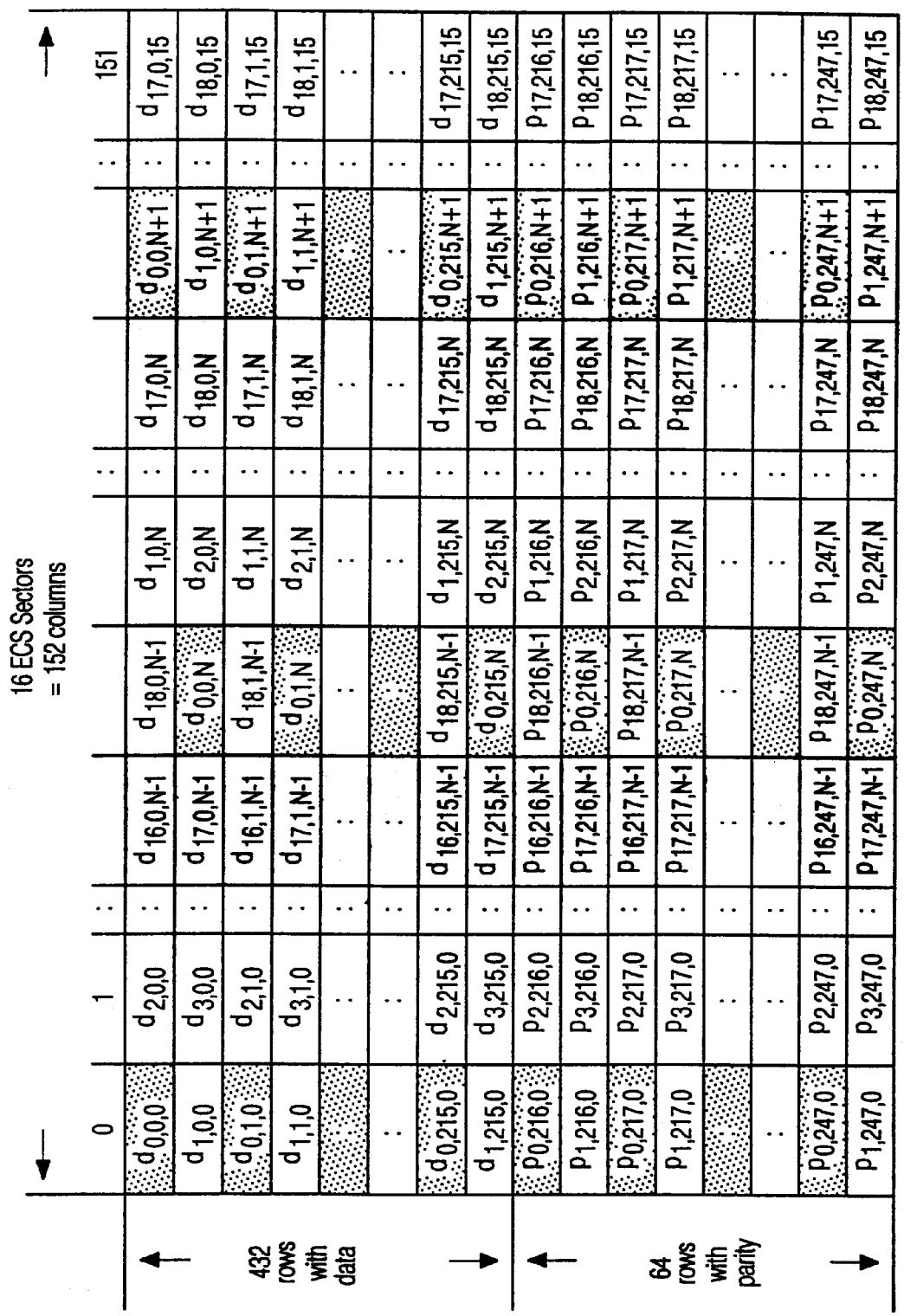
FIG. 10, a composition of an ECC cluster by multiplexing 16 ECC sectors.

After generating the LDS codewords in the ECC Sectors, 16 consecutive ECC Sectors are combined to one ECC Cluster by multiplexing the 16*19 columns of height 248, 2 by 2, including the parities. In this way 152 new columns are formed with a height of 496 bytes as shown in FIG. 10. The numbering of the bytes is according to $d_{L,M,N}$ where:

L=0 . . . 18 is the LDS code word number within the ECC Sector

M=0 . . . 247 is the byte number within the IDS code word

N=0 . . . 15 is the ECC Sector number.

Figure 11:
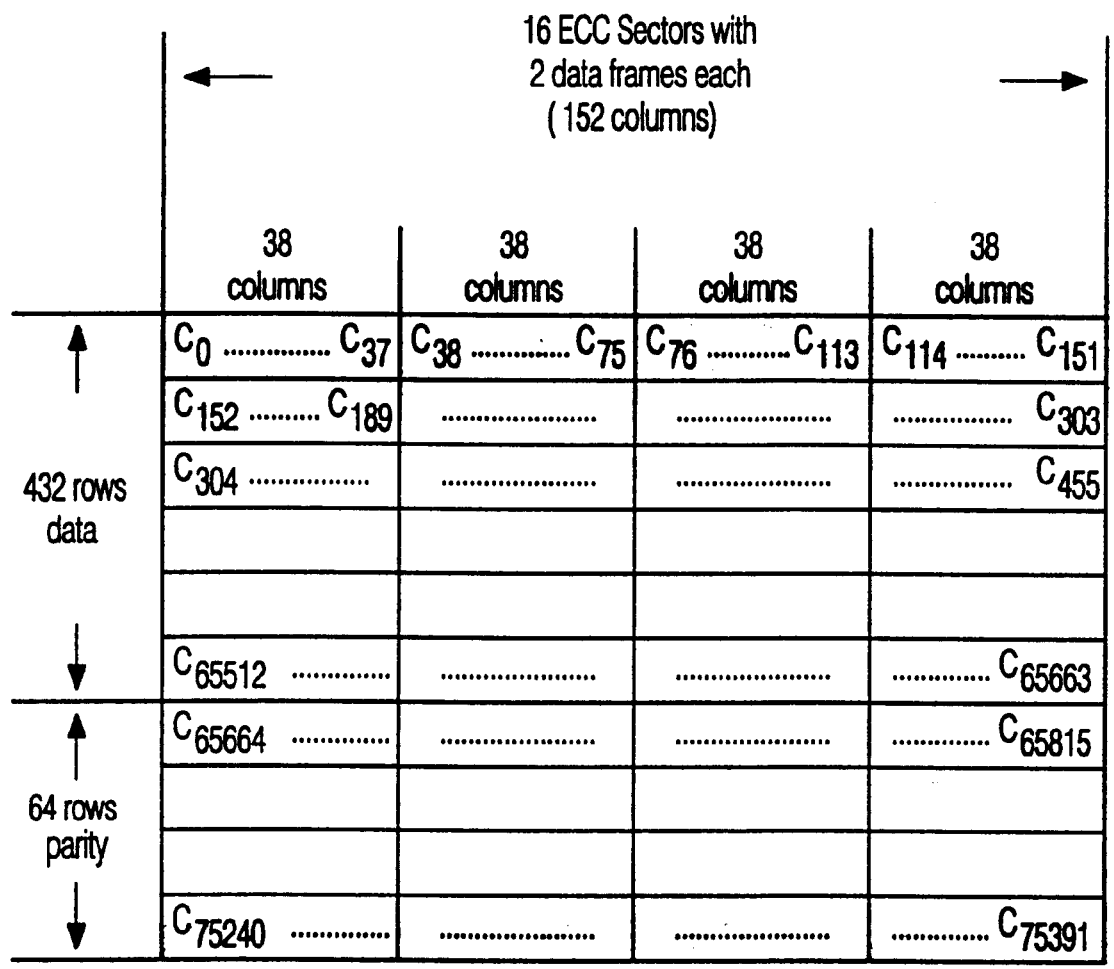
FIG. 11, a renumbered ECC cluster before interleaving.
Figure 12:
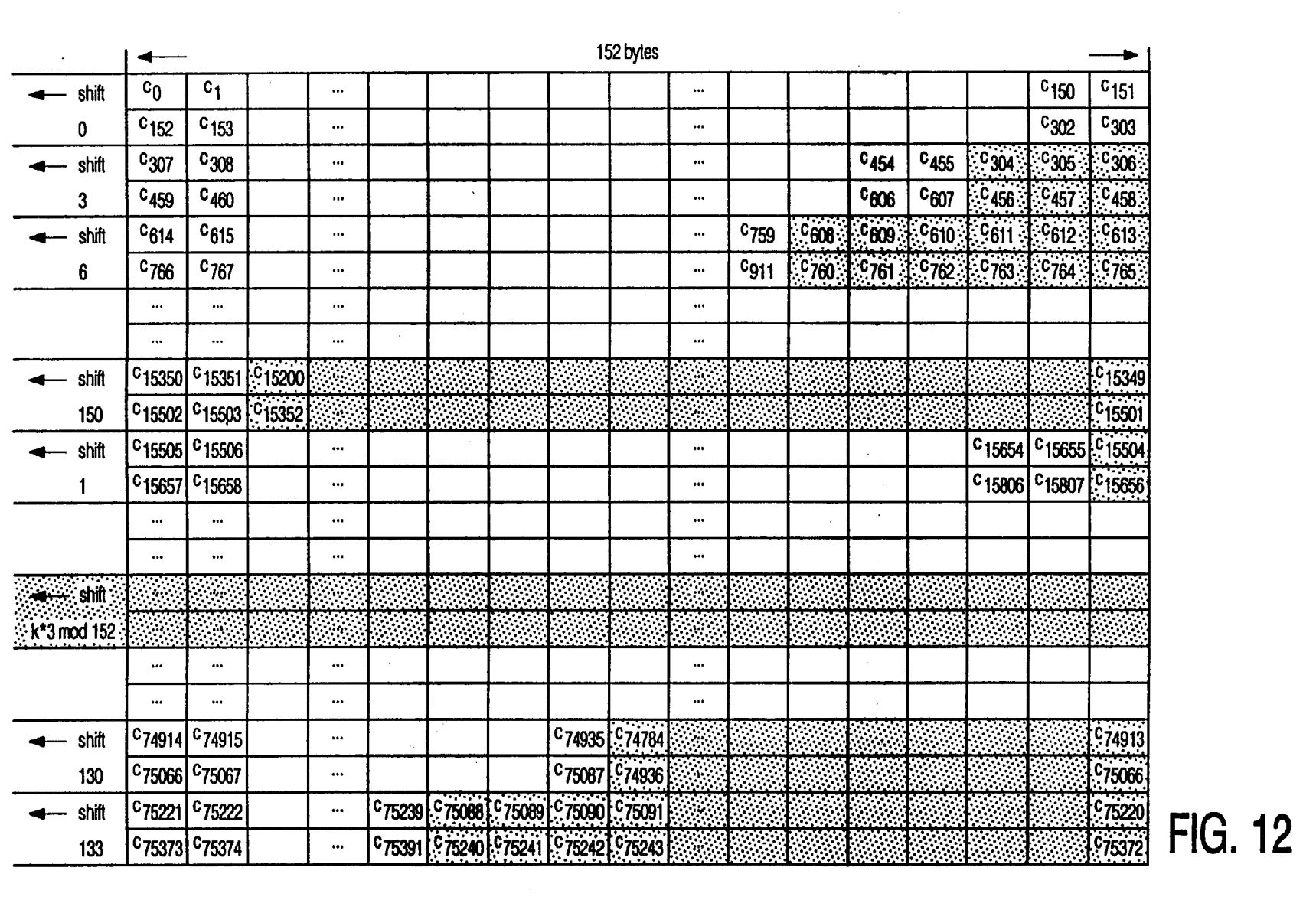

For further improving the burst error correcting capabilities, extra interleaving is introduced by renumbering the bytes are in horizontal direction through all rows of the ECC Cluster, cf. FIG. 11. Now all rows of an ECC Cluster are shifted two by two over mod(k*3,152) bytes to the left, starting from row 2 onwards, the first row being row 0; k=div(row-number, 2). The bytes that shift out at the left side re-enter the array from the right side, cf. FIG. 12. After this process the bytes are renumbered once more in horizontal direction through all rows, resulting in the numbering $D_0$ to $D_{75391}$ indicated in FIG. 6. The renumbering of the bytes causes non-uniform mapping of logical addresses on physical addresses. Consequences thereof will be discussed infra.

After interleaving, the interleaved ECC Cluster is split into 4 groups of 38 columns each. In between the 4 groups, 3 columns of one byte width each are inserted. These columns carry the address information relating to the data contained in the interleaved ECC Cluster. They consist of (62,30,33) RS BIS codewords with 30 bytes of information and 32 bytes of parity. Due to the high error protection capabilities and an advanced interleaving scheme, these columns may also offer a reliable indication of burst errors.

Figures 13, 14:
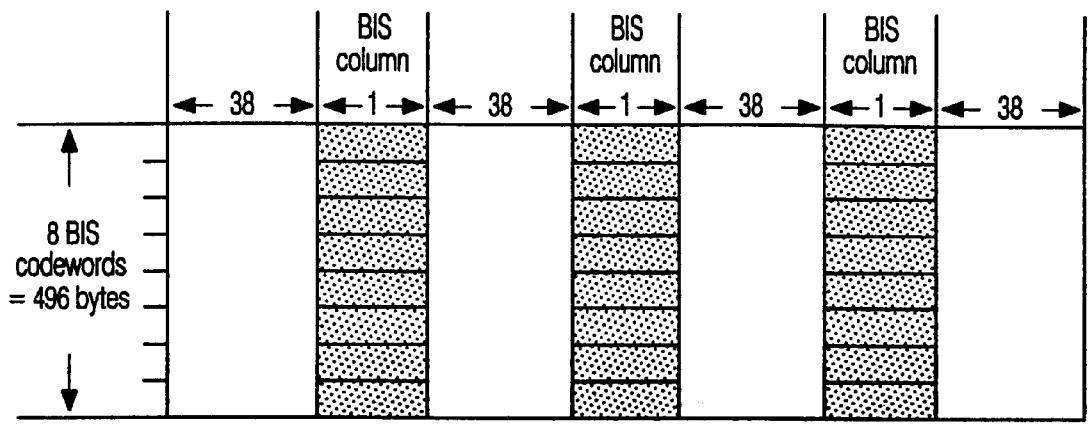
FIG. 13, multiplexing of the BIS cluster with the interleaved ECC cluster.
FIG. 14, a BIS block containing 24 BIS code words.

A 3 by 496 byte array formed by the 3 BIS columns from the Physical Cluster, is called a BIS Cluster. The content of the BIS Cluster is formed by placing all BIS codewords of a BIS Cluster in the 24 columns of a 24 by 62 byte array, cf. FIG. 14.

The BIS RS code is defined over the finite field $GF(2^8)$. The non-zero elements of the finite field $GF(2^8)$ are generated by a primitive element $\alpha$, that is a root of the primitive polynomial $p(x)=X^8+X^4+X^3+X^2+1$. The symbols of $GF(2^8)$ are represented by 8-bit bytes, using the polynomial base representation, with $(\alpha^7, \alpha^6, \ldots \alpha^2, \alpha, 1)$ as a basis. The root $\alpha$ is represented as $\alpha$=00000010.

Each BIS codeword is represented by a vector bis=$(b_{c,0} \ldots, b_{c,i} \ldots, b_{c,29}, Pb_{c,30}, \ldots Pb_{c,j} \ldots Pb_{c,61})$ in a Reed-Solomon code over $GF(2^8)$, with 32 parity bytes and 30 information bytes. Such codeword may be represented by a polynomial bis(x) of degree 61, that may have some coefficients zero, the highest degrees representing the information part of the vector $(b_{c,0} \ldots$ etc.) and the lowest degrees the parity part of the vector $(Pb_{c,30} \ldots$ etc.). Each codeword is a multiple of the generator polynomial g(x) of the BIS codeword:

$$g(x) = \prod_{i=0}^{31} (x - \alpha^i)$$

The BIS code is systematic: the 30 information bytes appear unaltered in the highest order positions of each codeword. The parity check matrix of code bis is such that $H_{BIS}*\text{bis}^T+0$ for all BIS codewords bis. The second row $h_{BIS\,2}$ of the parity check matrix $H_{BIS}$ is given by $h_{BIS\,2}=(\alpha^{61}, \alpha^{60} \ldots \alpha^2, \alpha, 1)$ It corresponds to the zero $\alpha$ of the generator polynomial g(x), and defines the codeword positions to be used for error locations.

Figure 15:
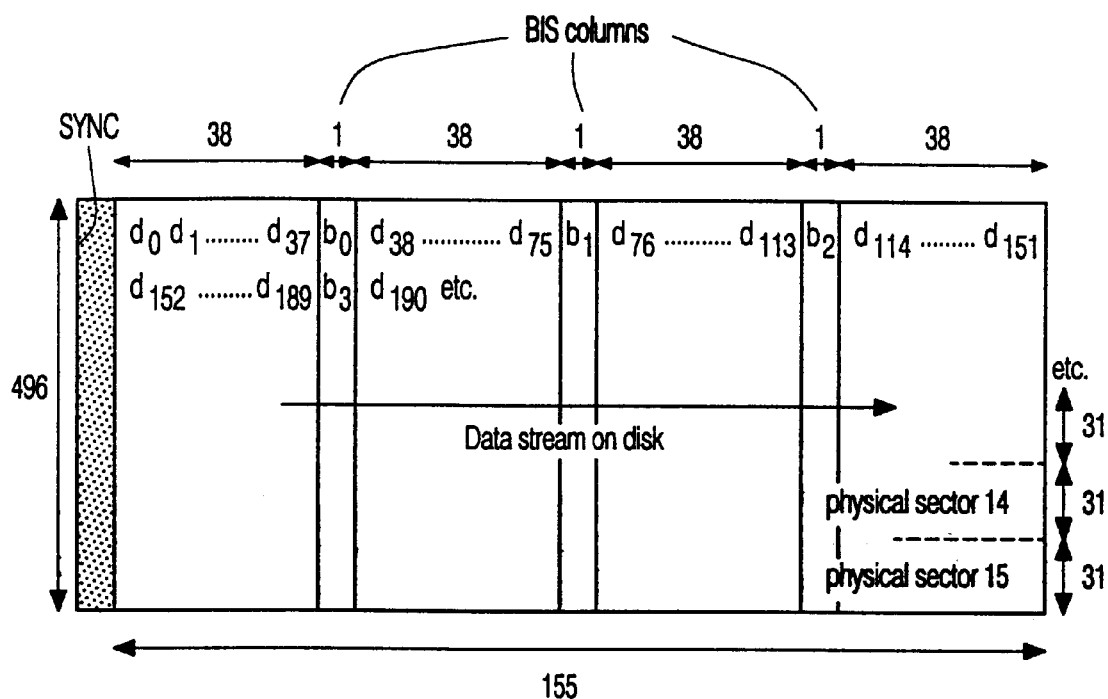
FIG. 15, the frame structure for explaining main data interleaving.

FIG. 15 shows the frame structure for explaining main data interleaving. The various physical sectors and columns carry appropriate numbering. There are 304*[248,216,33] LDS code words, and 24*[62,30,33] BIS code words.

Figure 16:
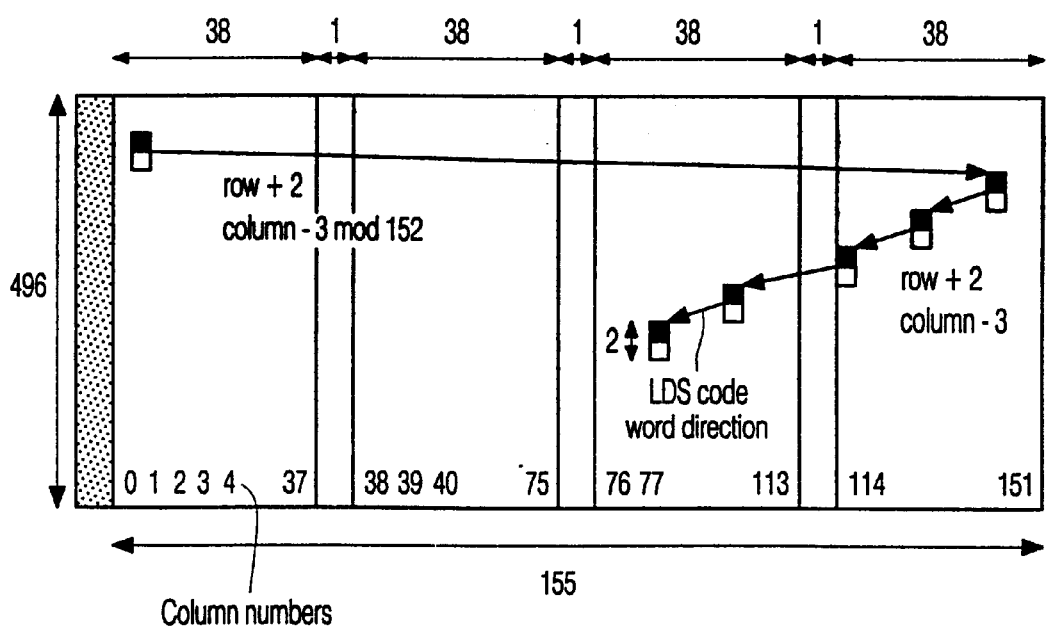
FIG. 16, the interleaving proper.

A 2 kB logical sector contains 9.5 LDS code words in which 2048 User Data bytes and 4 EDC bytes have been encoded, and further 22.5 BIS Bytes for storing a header, 4ID+2EDC bytes, copyright data, and 6 Copyright Management Information CPR_MAI. Furthermore, 10.5 BIS Bytes have been reserved for possible future use. A 4 kB Physical Sector consists of 31 rows, where the header bytes of two 2 kb logical sectors are stored in physically prescribed positions. FIG. 16 shows the interleaving proper. Here, the i-th LDS code word with $0 \leq i \leq 303$, contains 248 bytes d_j, where j is of the form: j=[(i mod 2)+2*a]*152+{[(i div 2)−3*a ]mod 152} for certain values $0 \leq a \leq 247$. Various locations are feasible for putting the parities, such as at the bottom, or permutated according to a+31*i, $a \geq 22$ . . .

Figure 14A:
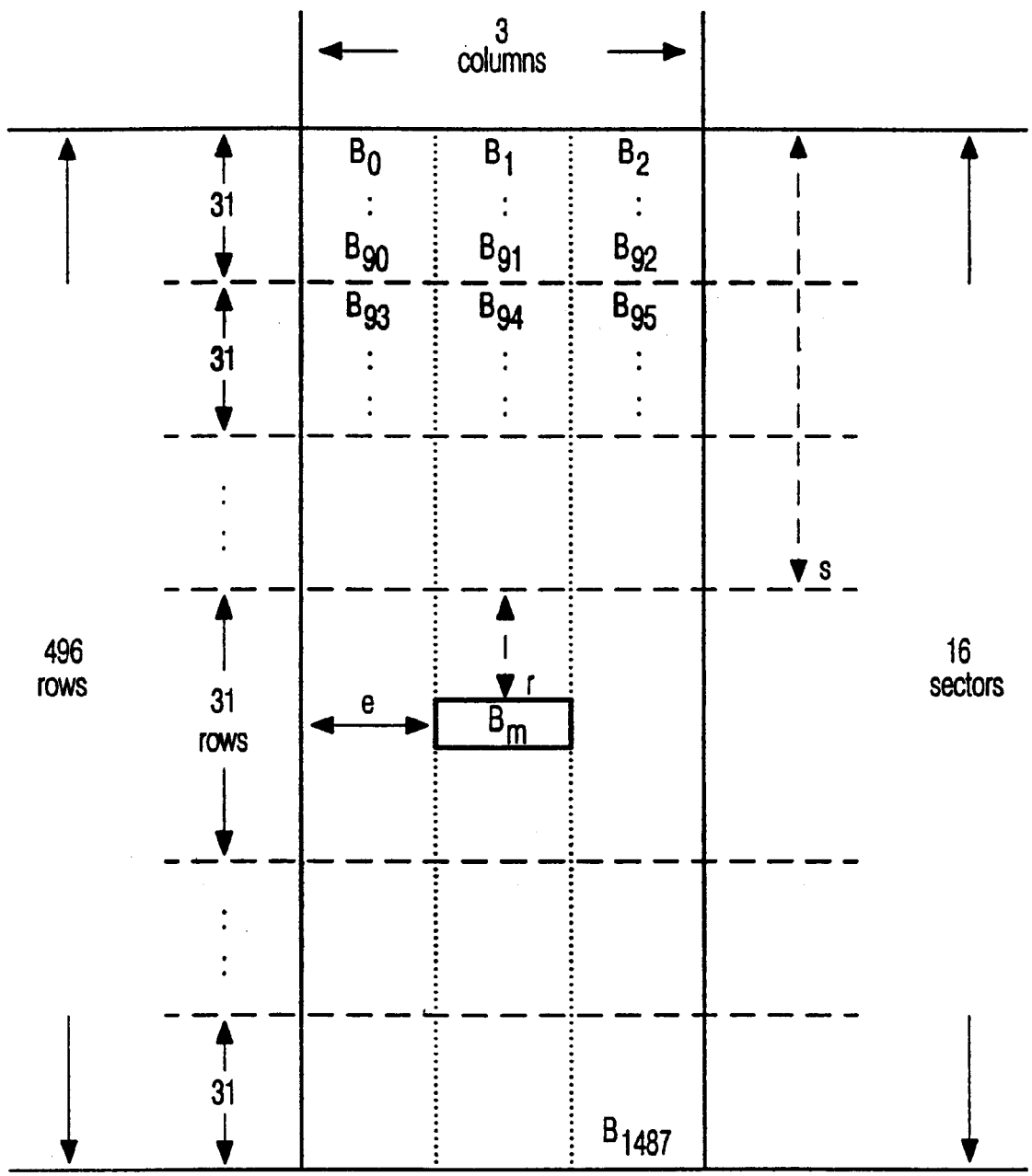
FIG. 14A, the mapping of the BIS block into the BIS cluster.

Next, the generating of a BIS cluster will be discussed. After generating the BIS codewords, the BIS Block is mapped in an interleaved manner on an array of 496=(16× 31) rows*3 columns. This new array is called a BIS Cluster shown in FIG. 14A. The positioning of the bytes from a BIS Block (FIG. 14) in a BIS Cluster will first be given by mathematical expressions. For this purpose, the BIS Cluster is subdivided according to the Physical Sectors shown in FIG. 6. The sectors are numbered s=1 . . . 15, the rows in such sector are numbered r=0 . . . 30, and the columns are numbered e=0 . . . 2, cf. FIG. 14a. Now byte $b_{N,C}$ gets the following position:

| | |
|---|---|
| sector number | s = mod {[div(N,2) + 8 − div(C,3)], 8 } + 8 * mod (N,2) |
| row number | r = div(N,2) |
| column number | e = mod {[C + div(N,2)] , 3} |

The byte number m gives the sequence number $B_m$ as the Physical cluster is written to the disc as shown in FIG. 6 according to m=(s*31+r)*3+e. The essentials of the interleaving scheme are exemplified in FIGS. 17, 18, and pertain to:

each row of the BIS Block is split into 8 groups of 3 bytes each, which three-byte groups are each placed in a respective row of the BIS Cluster.

the even rows of the BIS Block are mapped on Sectors 0 through 7, the odd rows of the BIS Block are mapped on Sectors 8 through 15.

the eight three-byte groups from an even row of the BIS Block are each put on the same row of eight successive sectors, using the Sectors in a direction that is reverse to their numbering.

It has been found that this reversal is effective for better dispersing of burst errors. The starting sector for each row of the BIS Block is one sector higher than for the previous row.

row N=0 of the BIS block is placed on rows r=0 of the sectors 0, 7, 6, 5, . . . 2, 1.

row N=2 of the BIS block is placed on rows r=1 of the sectors 1, 0, 7, 6, . . . 3, 2.

row N=4 of the BIS block is placed on rows r=2 of the sectors 2, 1, 0, 7, . . . 4, 3.

this procedure is cyclically repeated until row N=60, that is placed on the rows r=30 of the sectors 6, 5, 4, . . . 0, 7.

Now, within each sector, each row is shifted cyclically to the right by mod(r, 3) positions: so, row r=0 is not shifted at all, row r=1 is shifted 1, row r=2 is shifted 2, row r=3 is not shifted, row r=4 is shifted 1, etc. For the odd rows of the BIS Block a corresponding procedure is followed.

Figure 17:
FIG. 17, an example of the partial mapping of BIS bytes on the first eight sectors.

In this respect, FIG. 17 shows an example of the partial mapping of BIS bytes on the first eight sectors, and FIG. 18 an example of the partial mapping of BIS bytes on the last eight sectors, that after the foregoing are self-explanatory.

Figure 19:
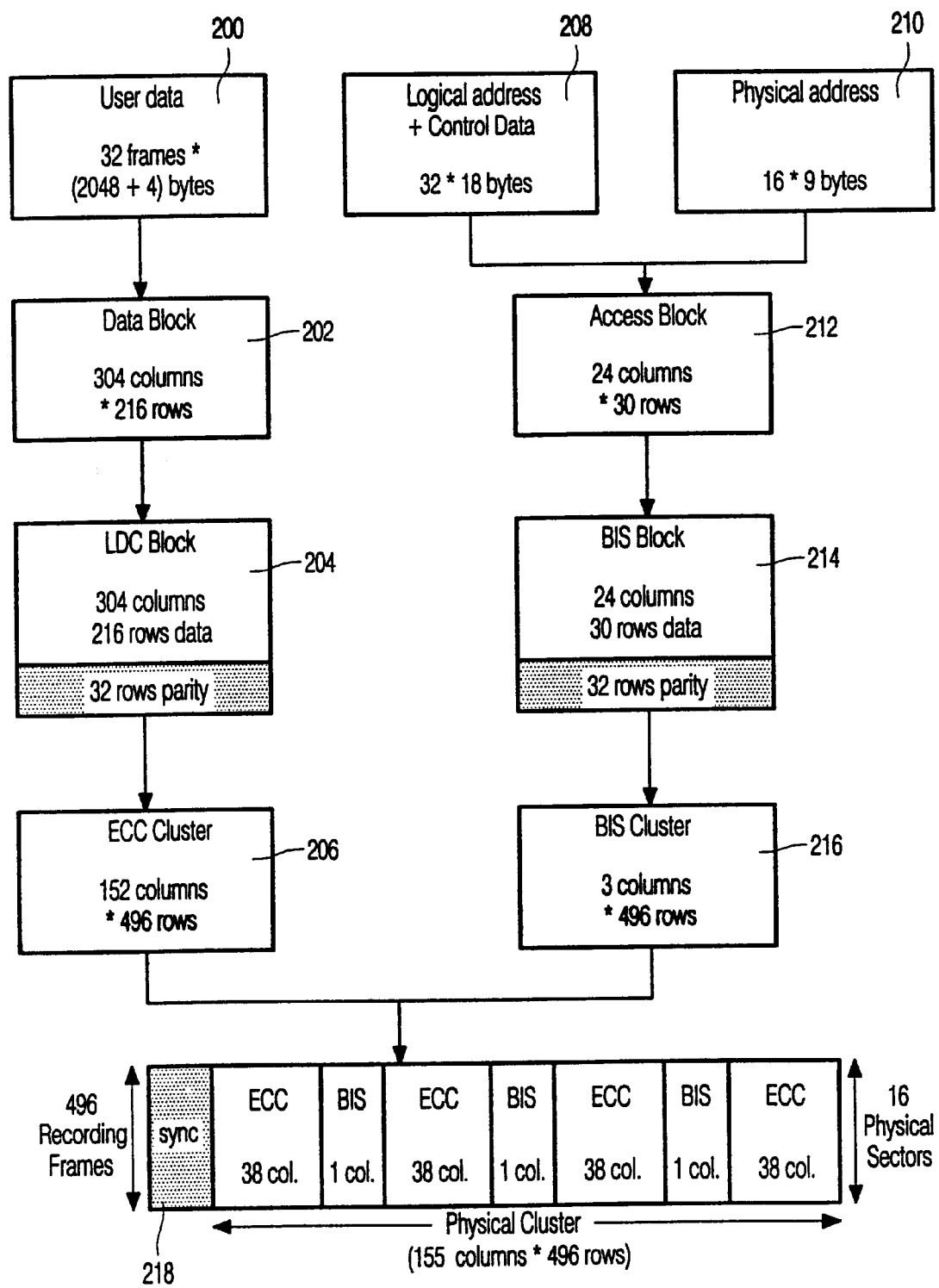
FIG. 19, a schematic representation of the overall encoding process.

FIG. 19 by way of recapitulation gives a schematic representation of the overall encoding process. The user data as received from a source that may be a host or an application are first divided into data frames that each consist of 2048+4 bytes; as shown in block 200 of the FIG., 32of these frames are taken into account for the next encoding step. In block 202, a Data Block is formed and arranged into 304 columns of 216 rows each. In block 204 a Long Distance Code block is formed through adding 32 rows parity. In block 206 an ECC cluster is arranged according to 152 columns and 496 rows. This is arranged to fill the four sections labeled ECC in the Physical Cluster block 218, that is the comprehensive code format entity.

The address and control data added by the Recording System are converted also in successive steps. First the Logical Address and Control Data is arranged in 32*18 bytes in block 208. The logical addresses are those that pertain to user functionalities, and may indicate aspects that relate to a duration of the rendering of a user program. Also the physical addresses are arranged into 16*9 bytes in block 210. The physical addresses relate to physical distances on the carrier. Due to the repeated renumbering and interleaving, the relation between physical and logical addresses has been broken. Items that follow each other closely in a program, may be spaced from each other by an appreciable physical distance, and vice versa. Also, the mapping is not uniformly progressing. In block 212, the addresses are combined in an Access Block of 24 columns by 30 rows. In block 214, there are 32 rows of parity added. In block 216, these arranged into a BIS cluster of 3 columns and 496 rows. These fill the three BIS columns in block 218. Also a column of sync bit groups is added, so that a physical cluster of 155 columns by 496 rows is formed. Together these form 16 Physical Sectors that are grouped into 496 Recording Frames as shown.

What is claimed is:

1. A method for encoding multiword information that is based on multibit symbols disposed in relative contiguity with respect to a medium, whilst providing wordwise interleaving and wordwise error protection code facilities, for so providing error locative clues across multiword groups, characterized by originating such clues both in high protectivity clue words (BIS) that are interleaved among clue columns and also in synchronizing columns constituted from synchronizing bit groups and locating said synchronizing columns where said clue columns are relatively scarcer disposed, said clues being directed to low protectivity target words (LDS) that are interleaved in a substantially uniform manner among target columns which form uniform-sized column groups between periodic arrangements of clue columns and synchronizing columns.

2. A method as claimed in claim 1, and arranging said information into uniform-sized physical clusters that each have a single synchronizing column and an odd number of clue columns.

3. A method as claimed in claim 1, whilst assigning user data exclusively to said target columns and assigning system data at least predominantly to said clue columns.

4. A method as claimed in claim 1, wherein at a lowest level a multi-symbol data frame of target symbols contains a multi-symbol but bit-organized error detection bit group EDC.

5. A method as claimed in claim 4, wherein at a next higher level an ECC sector contains a plurality of data frames for distribution over a plurality of target words through addition of Reed-Solomon redundancy.

6. A method as claimed in claim 5, while before said interleaving sequentially separating various code word blocks as a speeding up measure with respect to later decoding (FIG. 11).

7. A method as claimed in claim 1, whilst superposing said interleaving on row-wise incrementally rotating of target symbols within their cluster.

8. A method as claimed in claim 1 applied to storage on an optical medium.

9. A method as claimed in claim 1, wherein all clue words and target words carry a uniform amount of redundancy, but target words have more data symbols than clue words.

10. A method as claimed in claim 1, wherein the clue words of a comprehensive Physical Storage Cluster number a multiple (24/3) of the number of clue columns in the Physical Cluster; like-numbered symbols of the clue words being distributed into groups of as many symbols as there are clue columns in a Physical Cluster over like-ranked Recording Frames of different Physical Sectors of the Physical Cluster, in a staggered but otherwise uniform interleaving schedule among the various Recording Frames.

11. A method as claimed in claim 10, wherein even-numbered clue symbol rows are assigned to a first contiguous group of half of the Physical Sectors, and odd-numbered clue symbol rows are assigned to the second contiguous group of half of the Physical Sectors.

12. A method as claimed in claim 10, wherein the rows of clue column symbols are subjected to a staggered and systematic rotating among the various clue columns.

13. A method as claimed in claim 10, whilst assigning to clue words both logical and physical address data pertaining to the actual Physical Cluster.

14. A unitary storage carrier produced by a method as claimed in claim 1, and storing multiword information that is based on multibit symbols disposed in relative contiguity thereon, with wordwise interleaving and wordwise error protection code facilities that provide error locative clues across multiword groups, characterized by originating such clues both in high protectivity clue words that are interleaved among clue columns and also in synchronizing columns constituted from synchronizing bit groups and locating said synchronizing columns where said clue columns are relatively scarcer disposed, all clues being directed to low protectivity target words that are interleaved in a substantially uniform manner among target columns which form uniform-sized column groups between periodic arrangements of clue columns and synchronizing columns.

15. A carrier as claimed in claim 14, having arranged said information into uniform-sized physical clusters that each have a single synchronizing column and an odd number of clue columns.

16. A carrier as claimed in claim 14, having user data exclusively contained in target columns and system data at least substantially exclusively contained in clue columns.

17. A carrier as claimed in claim 14, wherein at a lowest level a multi-symbol data frame of target symbols also contains a multi-symbol but bit-organized error detection bit group.

18. A carrier as claimed in claim 17, wherein at a next higher level a data sector contains a plurality of data frames distributed over a plurality of target words through added Reed-Solomon redundancy.

19. A carrier as claimed in claim 18, having superposed said interleaving on row-wise incrementally rotation of target symbols within their cluster.

20. A carrier as claimed in claim 14, and based on an optical storage medium.

21. A carrier as claimed in claim 14, wherein all clue words and target words carry a uniform amount of redundancy, but target words have more data symbols than clue words.

22. A carrier as claimed in claim 14, wherein the clue words of a comprehensive Physical Storage Cluster number a multiple (24/3) of the number of clue columns in the Physical Cluster; like-numbered symbols of the clue words being distributed into groups of as many symbols as there are clue columns in a Physical Cluster over like-ranked Recording Frames of different Physical Sectors of the Physical Cluster, in a staggered but otherwise uniform interleaving schedule among the various Recording Frames.

23. A carrier as claimed in claim 22, wherein even-numbered symbol rows are assigned to a first contiguous group of half of the Physical Sectors, and odd-numbered symbol rows are assigned to the second contiguous group of half of the Physical Sectors.

24. A carrier as claimed in claim 22, wherein the rows of clue column symbols are located as subjected to a staggered and systematic rotating among the various clue columns.

25. A carrier as claimed in claim 22, wherein clue columns contain both logical and physical address data as pertaining to the actual Physical Cluster.

26. A method for decoding multiword information that is based on multibit symbols disposed in relative contiguity with respect to a medium, having wordwise interleaving and word-wise error protection code facilities, and so providing error locative clues across multiword groups as a preliminary measure before actually decoding, characterized by deriving such clues both from high protectivity clue words that are interleaved among clue columns and also from synchronizing columns constituted from synchronizing bit groups through accessing said synchronizing columns where said clue columns are relatively scarcer disposed, said clues being directed to low protectivity target words that are interleaved in a substantially uniform manner among target columns which form uniform-sized column groups between periodic arrangements of clue columns and synchronizing columns.

27. A method as claimed in claim 26, and accessing said information according to uniform-sized physical clusters that each have a single synchronizing column and an odd number of clue columns.

28. A method as claimed in claim 26, whilst deriving user data exclusively from said target columns and system data at least substantially exclusively from said clue columns.

29. A method as claimed in claim 26, and accessing at a lowest level within a multi-symbol data frame of target symbols a multi-symbol but bit-organized error detection bit group, as a preliminary decoding step.

30. A method as claimed in claim 29, whilst at a next higher level accessing within a data sector a plurality of respective data frames distributed over a plurality of target words through evaluating added Reed-Solomon redundancy.

31. A method as claimed in claim 26, whilst correcting for on said interleaving superposed a row-wise incremental rotating of target symbols within their cluster.

32. A method as claimed in claim 26 applied to storage on an optical medium.

33. A method as claimed in claim 26, whilst decoding all clue words and target words as based on a uniform amount of redundancy therein, whilst allowing in target words for more data symbols than in clue words.

34. A method as claimed in claim 26, wherein the clue words of a comprehensive Physical Storage Cluster number a multiple (24/3) of the number of clue columns in the Physical Cluster; like-numbered symbols of the clue words being derived from groups of as many symbols as there are clue columns in a Physical Cluster over like-ranked Recording Frames of different Physical Sectors of the Physical Cluster, in a staggered but otherwise uniform deinterleaving schedule among the various Recording Frames.

35. A method as claimed in claim 34, wherein even-numbered symbol rows are derived from a first contiguous group of half of the Physical Sectors, and odd-numbered symbol rows are derived from the second contiguous group of half of the Physical Sectors.

36. A method as claimed in claim 34, wherein the rows of clue column symbols are derived from staggered and systematically rotated symbols along the various clue columns.

37. A method as claimed in claim 34, whilst deriving from clue words both logical address data and physical address data pertaining to the actual Physical Cluster.

38. A device for encoding multiword information that is based on multibit symbols disposed in relative contiguity with respect to a medium, through providing wordwise interleaving means and wordwise error protection encoding means, for so providing error locative clues across multiword groups,
characterized by said encoding means directing such clues both to high protectivity clue words that are interleaved among clue columns and also to synchronizing columns constituted from synchronizing bit groups through locating means for locating said synchronizing columns where said clue columns are relatively scarcer disposed, all clues being directed to low protectivity target words that are interleaved in a substantially uniform manner among target columns which form uniform-sized column groups between periodic arrangements of clue columns and synchronizing columns.

39. A device as claimed in claim 38, and having arranging means for arranging said information into uniform-sized physical clusters that each have a single synchronizing column and an odd number of clue columns.

40. A device as claimed in claim 38, being arranged for assigning user data exclusively to said target columns and system data at least substantially exclusively to said clue columns.

41. A device as claimed in claim 38, having generator means for at a lowest level in a multi-symbol data frame of target symbols also generating a multi-symbol but bit-organized error detection bit group.

42. A device as claimed in claim 41, arranged for at a next higher level forming a data sector to contain a plurality of data frames for distributed over a plurality of target words thru added Reed-Solomon redundancy.

43. A device as claimed in claim 38, and having superposing means for superposing said interleaving on row-wise incrementally rotating of target symbols within their cluster.

44. A device as claimed in claim 38, and having interfacing means for interfacing to an optical storage medium.

45. A device as claimed in claim 38, wherein said encoding means are arranged for assigning to all clue words and target words to carry a uniform amount of redundancy, but to target words a larger amount of data symbols than to clue words.

46. A device as claimed in claim 38, wherein the clue words of a comprehensive Physical Storage Cluster number a multiple (24/3) of the number of clue columns in a Physical Cluster; said device having distributing means for distributing like-numbered symbols of the clue words in groups of as many symbols as there are clue columns in a Physical Cluster, over like-ranked Recording Frames of different Physical Sectors of the Physical Cluster, in a staggered but otherwise uniform interleaving schedule among the various Recording Frames.

47. A device as claimed in claim 38, having assigning means for assigning even-numbered symbol rows to a first contiguous group of half of the Physical Sectors, and odd-numbered symbol rows to the second contiguous group of half of the Physical Sectors.

48. A device as claimed in claim 38, and having rotating means for subjecting the rows of clue column symbols to a staggered and systematic rotating among the various clue columns.

49. A device as claimed in claim 38, and having address assigning means for assigning to clue words both logical and physical address means pertaining to the actual Physical Cluster.

50. A device for decoding multiword information that is based on multibit symbols disposed in relative contiguity with respect to a medium, through effecting wordwise deinterleaving and wordwise error code protecting facilities, and so providing error locative clues across multiword groups,
characterized by being arranged for deriving such clues both from high protectivity clue words that are interleaved among clue columns and also from synchronizing columns constituted from synchronizing bit groups, through accessing means for accessing said synchronizing columns where said clue columns are relatively scarcer disposed, all clues being directed to low protectivity target words that are interleaved in a substantially uniform manner among target columns which form uniform-sized column groups between periodic arrangements of clue columns and synchronizing columns.

51. A device as claimed in claim 50, and having accessing means for accessing said information according to uniform-sized physical clusters that each have a single synchronizing column and an odd number of clue columns.

52. A device as claimed in claim 50, being arranged for deriving user data exclusively from target columns and system data at least substantially exclusively from clue columns.

53. A device as claimed in claim 50, and having accessing means for accessing at a lowest level within a data frame a multi-symbol but bit-organized error detection bit group, for therefrom deriving an error detecting signal.

54. A device as claimed in claim 53, wherein said accessing means are arranged for at a next higher level accessing within a data sector a plurality of respective data frames distributed over a plurality of target words through evaluating added Reed-Solomon redundancy.

55. A device as claimed in claim 50, having corrector means for superposing on said interleaving a row-wise incrementally backrotating of target symbols within their cluster.

56. A device as claimed in claim 50, and having interface means for interfacing to an optical storage medium.

57. A device as claimed in claim 50, said decoding means being arranged for decoding all clue words all and target words through a uniform amount of redundancy, but for deriving from target words a larger amount of data symbols than from clue words.

58. A device as claimed in claim 50, wherein the clue words of a comprehensive Physical Storage Cluster number a multiple (24/3) of the number of clue columns in the Physical Cluster; and being arranged for deriving like-numbered symbols of the clue words as being distributed into groups of as many symbols as there are clue columns in a Physical Cluster from like-ranked Recording Frames of different Physical Sectors of the Physical Cluster, in a staggered but otherwise uniform interleaving schedule among the various Recording Frames.

59. A device method as claimed in claim 58, and being arranged for deriving even-numbered symbol rows from a first contiguous group of half of the Physical Sectors, and odd-numbered symbol rows from the second contiguous group of half of the Physical Sectors.

60. A device as claimed in claim 58, being arranged for deriving the rows of clue column symbols through staggered and systematic backrotating over the various clue columns.

61. A device as claimed in claim 50, being arranged for deriving both logical and physical address data from the clue columns as pertaining to the actual Physical Cluster.

* * * * *